United States Patent [19]

Leyrer et al.

[11] 4,456,679

[45] Jun. 26, 1984

[54] PRODUCTION OF RELIEF IMAGES OR RESIST IMAGES BY A POSITIVE-WORKING METHOD

[75] Inventors: Reinhold J. Leyrer, Ludwigshafen; Dietrich Saenger, Frankenthal, both of Fed. Rep. of Germany

[73] Assignee: BASF Aktiengesellschaft, Fed. Rep. of Germany

[21] Appl. No.: 525,395

[22] Filed: Aug. 22, 1983

[30] Foreign Application Priority Data

Aug. 21, 1982 [DE] Fed. Rep. of Germany ....... 3231147

[51] Int. Cl.$^3$ .............................................. G03C 5/00
[52] U.S. Cl. .................................... 430/326; 430/270; 430/280; 430/328; 430/330; 204/159.14
[58] Field of Search ............... 430/270, 328, 326, 330, 430/280; 204/159.14

Primary Examiner—Jack P. Brammer
Attorney, Agent, or Firm—Keil & Weinkauf

[57] ABSTRACT

Relief images or resist images are produced by a positive-working process, using a solid photosensitive resist layer which is applied to a base and contains a compound possessing two or more aromatic and/or heteroaromatic o-nitrocarbinol ester groups and cross-linking compounds possessing two or more reactive groups which are capable, under the action of heat, of reacting with carboxyl groups to form a covalent chemical bond. To produce the relief images or resist images, the photosensitive resist layer is first exposed imagewise to actinic light, the exposed areas of this layer are then washed out with an aqueous developer, the remaining resist layer is post-exposed uniformly to actinic light and finally the post-exposed resist layer is thermally crosslinked and hardened.

19 Claims, No Drawings

PRODUCTION OF RELIEF IMAGES OR RESIST IMAGES BY A POSITIVE-WORKING METHOD

The present invention relates to a positive-working process for the production of relief images or resist images on a base using a photosensitive recording material which comprises a solid photosensitive resist layer which is applied to the base and contains, as the photosensitive component, a compound possessing aromatic and/or heteroaromatic o-nitrocarbinol ester groups. To produce the relief images, eg. offset printing plates, or resist images, the photosensitive resist layer is exposed imagewise to actinic light, and the exposed areas of this layer are then washed out with an aqueous developer.

A large number of positive-working photosensitive recording materials and processes for producing images using these recording materials are known. For the purposes of the present invention, positive-working recording materials or positive-working processes for producing images are those in which, after imagewise exposure of the photosensitive layer, the exposed areas of this layer become soluble in solvents in which they were previously insoluble. Hence, the exposed areas are removed during development of the photosensitive layer, and a positive image of the image-bearing transparency is obtained.

Positive-working coating materials based on o-quinonediazide compounds which, on exposure, react to form alkali-soluble photolysis products, as described in, for example, German Laid-Open Application DOS Nos. 2,028,903 and 2,236,941, have only a short shelf life and, when stored at elevated temperatures, exhibit signs of decomposition, with elimination of nitrogen. Furthermore, further processing of these materials on metallic surfaces has to be carried out rapidly, since the decomposition of the diazide groups is catalyzed by heavy metals and heavy metal salts (for example in electroplating baths). Moreover, o-quinonediazide derivatives are unstable in the presence of aqueous alkalis, which restricts their use further.

German Published Application DAS No. 2,258,880 discloses that positive resist images can be produced by exposing a photosensitive layer imagewise and then developing it, if a photosensitive mixture containing an epoxy resin, a tertiary amine, a halohydrocarbon, dicyanamide and a solvent is used. The imagewise exposure initially results only in a difference in the curability of the photosensitive layer. To produce the solubility difference required for the development of the resist image, the photosensitive layer, after having been exposed, has to be hardened by heating. A decisive disadvantage of the photosensitive mixtures disclosed in DAS No. 2,258,880 is their low thermal stability in the unexposed state; this has a very adverse effect on the handling and processing of these mixtures. In particular, these systems cannot be processed by the well-tried dry laminating method usually used today.

German Laid-Open Applications DOS Nos. 2,150,691 and 2,922,746 describe positive-working recording materials, for the production of relief images or resist images, whose photosensitive layer is based on o-nitrocarbinol ester-containing polymers which can be washed out with an alkaline solvent after exposure. These conventional coating materials, which can be used for the production of resist layers or lithographic printing plates, are thermally stable in the unexposed state, so that they have a long shelf life and can be processed by a simple method, for example by lamination. However, the thermal stability of these coating materials after exposure and development is still insufficient for many end uses, since the strength of the resist layers produced from them decreases sharply above 50° C. Furthermore, although their resistance to strong and corrosive acids and alkalis, as may be used in, for example, electroplating baths or etching baths, is in general adequate, it is on the other hand limited and in need of further improvement. Moreover, the tracking resistance of these materials is unsatisfactory, so that they can only be used with reservations as a solder mask, for example in the production of printed circuits.

Furthermore, German Published Application DAS No. 2,309,062 discloses that relief images or resist images can be produced from photosensitive layers which contain an aromatic o-nitrocarbinol ester-containing compound as well as an epoxy resin prepolymer, by a method in which the photosensitive layer is exposed imagewise, the latent image produced by exposure is selectively hardened in the exposed layer by heat treatment, and the unexposed, unhardened parts of the layer are then removed by means of a solvent. However, this process is negative-working, and requires an organic solvent for developing the exposed and selectively hardened layer. In order to be able to carry out the development in aqueous solvents, o-nitrocarbinol ester-containing compounds which are water-soluble as such have to be employed in this process. In this case, however, the end product, ie. the relief image or resist image produced, does not possess the requisite stability to the chemicals used in further processing, in particular to strong alkalis or acids as used in, for example, electroplating baths or etching baths. The strength of such layers is also insufficient for them to be used for offset printing plates intended for long runs.

Finally, German Laid-Open Application DOS No. 2,242,394 describes mixtures which are curable under the action of light and comprise an aromatic or heteroaromatic o-nitrocarbinol ester-containing compound and aziridine- or isocyanate-containing compounds. According to DOS No. 2,242,394, these photocurable mixtures are used for the production of moldings, impregnations, coatings, coverings, printing inks, etc. For this purpose, the photosensitive layers and coverings produced from these mixtures are exposed uniformly and thoroughly hardened. The production of relief images or resist images is not touched upon in this publication.

It is an object of the present invention to provide a positive-working process for the production of relief images, in particular offset printing plates, or resist images using a photosensitive recording material which, while exhibiting high resolution, in particular in thin layers, gives relief images or resist images which possess good thermal stability, high mechanical strength, improved resistance to the strong alkalis or acids used in electroplating baths or etching baths and good insulating properties, such as high tracking resistance and dielectric strength. It is a further object to provide a process which is easy to carry out and does not cause pollution of the environment, it being possible to use aqueous developers, and which in addition is flexible and capable of being readily adapted to the particular intended use, so that it can be used for a wide range of applications.

We have found that, surprisingly, these objects are achieved if a photosensitive recording material is employed whose photosensitive layer contains a compound possessing two or more aromatic and/or heteroaromatic o-nitrocarbinol ester groups and a compound which effects crosslinking and possesses two or more reactive groups which are capable of reacting with —COOH groups to form a covalent chemical bond, and this photosensitive layer is exposed imagewise to actinic light, the exposed areas of the layer are removed with an aqueous developer and the resulting relief image or resist image is irradiated uniformly with actinic light and then crosslinked and hardened by the action of heat.

The present invention accordingly relates to a process for the production of a relief image, in particular a lithographic printing plate, or a resist image, which constitutes a positive image of an image-bearing transparency, in which a solid photosensitive resist layer applied to a base is exposed imagewise to actinic light and the exposed areas of the resist layer are then washed out with an aqueous developer, wherein the photosensitive resist layer contains, as the photosensitive component, a compound possessing two or more aromatic and/or heteroaromatic o-nitrocarbinol ester groups of the formula (I)

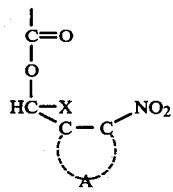

(I)

where A is the radical of an unsubstituted or substituted 5-membered to 14-membered aromatic or heteroaromatic ring system, and X is hydrogen, alkyl of 1 to 8 carbon atoms or an unsubstituted or substituted aryl or aralkyl radical, and wherein the said layer contains a compound which effects crosslinking and possesses two or more reactive groups which are capable of reacting with —COOH groups under the action of heat to form a covalent chemical bond, and wherein the said layer is exposed imagewise, developed, post-exposed uniformly to actinic light and then crosslinked and hardened under the action of heat.

Although the development of the imagewise exposed resist layer can be carried out using aqueous solvents, the novel process gives relief images and resist images which are very resistant to aqueous treating agents, in particular strong alkalis or acids, as used in electroplating baths or etching baths. The resulting relief images or resist images possess good thermal stability, ie. they still have very high mechanical strength even at relatively high temperatures, eg. above 100° C. Furthermore, they exhibit high tracking resistance and dielectric strength, which make them particularly useful as solder masks in the production of printed circuits. Owing to the high resolution of the photosensitive resist layer, the novel process can also be used for the faithful reproduction of very fine sections, such as lines, hairlines or dots, in thin films. A particular advantage of the novel process is that, depending on the intended use, the degree of hardening and hence the layer properties can be adjusted continuously via the post-exposure time, the luminous intensity, the type and amount of the compounds present in the photosensitive layer which contain groups which are reactive toward carboxylic acid radicals, and the temperature using during hardening. The high abrasion resistance of the post-cured image sections permits the production of lithographic printing plates which are particularly suitable for long runs.

The novel process is carried out using a photosensitive recording material comprising a photosensitive resist layer applied to a base. The choice of the base depends on the intended use of the relief image or resist image to be produced. Examples of suitable bases are metallic, metal oxide or ceramic substrates, as well as films and sheets of polymeric substances. For example, copper sheets or copper-plated substrates are used as bases for the production of etch resists or plating resists. For the production of thin-film integrated circuits, in particular ceramic substrates, which are coated with metallic or metal oxide layers, or semiconductor elements are employed as bases. For the production of relief images, in particular offset printing plates, suitable bases are metals, eg. steel or aluminum sheets which have been mechanically or electrochemically roughened or possess an anodically produced oxide layer, or plastic films, eg. of polyesters, which may also be coated with the metal by vapor deposition. For the production of a solder mask, the photosensitive resist layer can, for example, be applied to the circuit diagram of a printed circuit as the base, this being done by a conventional technique, either from solution, eg. by spin-coating, casting, immersion, etc., or by a conventional dry lamination process.

The photosensitive resist layers employed in the novel process contain, as the photosensitive component, a compound possessing two or more aromatic and/or heteroaromatic o-nitrocarbinol ester groups of the general formula (I)

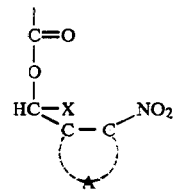

(I)

where A is the radical of an unsubstituted or substituted 5-membered to 14-membered aromatic or heteroaromatic ring system, and X is hydrogen, alkyl of 1 to 8 carbon atoms or an unsubstituted or substituted aryl or aralkyl radical.

The aromatic or heteroaromatic ring system A containing the nitro group in the ortho-position can be mononuclear or polynuclear. A particularly preferred aromatic ring system is benzene, and the benzene ring can be monosubstituted or polysubstituted, for example by $C_1-C_8$-alkyl, in particular methyl, by $C_1-C_6$-alkoxy, in particular methoxy, by halogen, eg. chlorine or bromine, or by nitro, amino, monomethylamino, dimethylamino, nitrile or sulfo. Examples of polynuclear aromatic ring systems are naphthalene, anthracene, anthraquinone, phenanthrene and the corresponding substituted derivatives. A preferred heteroaromatic ring system is the pyridine radical. X is, in particular, hydrogen, methyl, ethyl or unsubstituted or substituted phenyl.

Examples of particularly preferred aromatic or heteroaromatic o-nitrocarbinols from which the o-nitrocarbinol ester groups of the general formula (I) are derived are o-nitrobenzyl alcohol, 2-nitro-6-chlorobenzyl alcohol, 2-nitro-4-cyanobenzyl alcohol, 2-nitro-4,5-dimethoxybenzyl alcohol, α-methyl-o-nitrobenzyl alcohol, α-phenyl-o-nitrobenzyl alcohol, α-(o-nitrophenyl)-o-nitrobenzyl alcohol and 2-nitro-3-hydroxymethyl-pyridine.

Suitable compounds containing aromatic and/or heteroaromatic o-nitrocarbinol ester groups are low molecular weight esters possessing two or more ester groups of the general formula (I). These include, in particular, the diesters and/or polyesters of low molecular weight dicarboxylic acids and/or polycarboxylic acids with aromatic and/or heteroaromatic o-nitrocarbinols of the type discussed. Examples of low molecular weight dicarboxylic acids and polycarboxylic acids from which such esters can be derived are oxalic acid, malonic acid, adipic acid, maleic acid, fumaric acid, crotonic-acid, terephthalic acid, trimellitic acid and trimesic acid.

If compounds containing o-nitrocarbinol ester groups of the formula (I) are employed as the photosensitive component, the photosensitive resist layer advantageously also contains a polymeric binder which is compatible with the esters; for example, acrylate and/or methacrylate polymers have proved particularly useful for this purpose. Other suitable polymeric binders for the photosensitive resist layer are the high molecular weight compounds described below, which effect crosslinking and possess groups which are reactive toward carboxyl groups. Where low molecular weight compounds containing o-nitrocarbinol ester groups of the formula (I) are used as the photosensitive component, the amount of these in the photosensitive resist layer is such that this layer, after imagewise exposure, can be washed out with an aqueous developer, and the desired degree of crosslinking is achieved during thermal hardening of the relief images and resist images. For this purpose, it is generally sufficient if the photosensitive resist layer contains from 2 to 30, in particular from 10 to 15, % by weight, calculated as —COO— and based on the total photosensitive resist layer, of the aromatic and/or heteroaromatic o-nitrocarbinol ester groups of the formula (I).

Photosensitive resist layers which have proved particularly useful in the novel process are those which contain, as the photosensitive component, a polymer which has a molecular weight of above 500 and contains not less than 5% by weight, based on the molecular weight of the polymer, of aromatic and/or heteroaromatic o-nitrocarbinol ester groups of the general formula (I) bonded in the molecule. Regarding these polymers and their preparation, reference may be made, in particular, to German Laid-Open Application DOS No. 2,150,691, cited at the outset.

An advantageous o-nitrocarbinol ester-containing polymer is an organic polycarboxylic acid whose carboxyl groups are esterified with the aromatic and/or heteroaromatic o-nitrocarbinols. The organic polycarboxylic acids are in general homopolymers or copolymers of ethylenically unsaturated mono- or dicarboxylic acids of 3 to 6 carbon atoms, in particular of acrylic acid, methacrylic acid, maleic acid, fumaric acid or crotonic acid. Particularly important comonomers are ethylene, styrene and the $C_1$-$C_8$-alkyl esters of the above ethylenically unsaturated carboxylic acids.

It should be pointed out that virtually all carboxyl groups of the o-nitrocarbinol ester-containing polycarboxylic acid must be esterified or be present in a form which cannot react directly with the reactive groups of the crosslinking component described below, if it is desired that the photosensitive resist material, in the form of a solution or of a film resist material, have a long shelf life in the dark or in yellow light. Otherwise, there is a danger that the said resist material will undergo partial crosslinking and hardening even before exposure to actinic light, for example during storage of the recording material, with the result that it would only be of limited use for the novel process.

The amount of o-nitrocarbinol ester groups of the formula (I) present in the polymer is in general not less than 5% by weight, based on the molecular weight of the polymer, and can vary within wide limits, depending on the desired properties of the photosensitive resist layer and of the relief images or resist images produced therefrom. During exposure to actinic light, the o-nitrocarbinol ester groups undergo cleavage, and free carboxyl groups are formed in the polymer, with the result that the solubility of the latter is changed; hence, the content of o-nitrocarbinol ester groups of the general formula (I) in the polymer should be chosen so that these polymers, after imagewise exposure of the photosensitive resist layer, are soluble or dispersible in aqueous solvents, eg. water or aqueous alkaline solutions.

The photosensitive resist layer employed in the novel process also contains a compound which effects crosslinking and contains two or more reactive groups which are capable of reacting with —COOH groups under the action of heat to form a covalent chemical bond. Since the crosslinking and hardening in the novel process take place after the imagewise exposure and development of the photosensitive resist layer, the reactivity of the said reactive groups should be matched to the other process conditions (for example the imagewise exposure time and in particular the time and temperature required for the development of the exposed resist (layer) so as to ensure that, after the imagewise exposure, the exposed areas of the layer can be satisfactorily washed out with the aqueous developer. If, for example, the time between imagewise exposure of the photosensitive resist layer and development is too long, or the development time is too long or the development temperature is too high, with respect to the reactivity of the compound which effects crosslinking and contains reactive groups, it may be possible for the carboxyl groups produced during imagewise exposure to react with the crosslinking compound before or during development, so that satisfactory development of the relief image or resist image is not ensured. The photosensitive resist layer therefore preferably contains those crosslinking compounds which react with the free carboxyl groups at an appreciable rate only at elevated temperatures, for example at above 40° C. Examples of reactive crosslinking groups of the type under discussion which are particularly useful for the novel process are amine, imine, amide, epoxide, hydroxyl and/or blocked or unblocked isocyanate groups.

In one embodiment of the novel process, the photosensitive resist layer used can contain the aromatic and/or heteroaromatic o-nitrocarbinol ester groups of the general formula (I) and the crosslinking reactive groups of the above type bonded in one and the same molecule. Such compounds are, in particular, copolymers which carry aromatic and/or heteroaromatic o-nitrocarbinol ester groups and which contain, as copolymerised units, comonomers possessing the crosslinking reactive groups, eg. amine, imine, amide, epoxide, hydroxyl and/or blocked or unblocked isocyanate groups. Particularly suitable comonomers of this type are those containing epoxide, hydroxyl, isocyanate and/or blocked isocyanate groups, for example, N,N-dimethylaminoethyl acrylate or methacrylate; N-vinylimidazole; acrylamide or methacrylamide; and preferably glycidyl esters of unsaturated acids, in particular of acrylic acid or methacrylic acid, such as glycidyl acrylate or methacrylate; glycidyl ethers of unsaturated alcohols, such as allyl glycidyl ether or 4-vinylcyclohexene dioxide; vinyl isocyanate or allyl isocyanate; monoesters of diols with unsaturated acids, in particular with acrylic acid or methacrylic acid, such as hydroxyethyl acrylate or methacrylate, hydroxypropyl acrylate or methacrylate or butanediol monoacrylate or monomethacrylate; and methylol compounds of the amol type, eg. N-methylolacrylamide.

In another embodiment of the invention, the photosensitive resist layer can contain the crosslinking compounds, which possess reactive groups, in addition to the compound containing aromatic and/or heteroaromatic o-nitrocarbinol ester groups. In this case, the crosslinking compounds can be high molecular weight compounds, eg. appropriate polymers, or appropriate low molecular weight compounds. If the said crosslinking compounds are introduced into the photosensitive resist layer as components of the mixture, they should be compatible with the compound containing the armoatic and/or heteroaromatic o-nitrocarbinol ester groups. Preferred classes of crosslinking compounds which possess two or more reactive groups and are present as such components are diepoxides or polyepoxides, free or blocked di- or polyisocyanates, carbodiimides, dihydroxides or polyhydroxides and diamines or polyamines. The photosensitive resist layer may contain one or more of the crosslinking compounds, for example two or more different crosslinking compounds, such as epoxides, isocyanates and/or blocked isocyanates.

The diepoxides or polyepoxides include the reaction products of epichlorohydrin with polyols, the reaction products of epichlorohydrin with polyamines, polyolefin-epoxides, epoxidized polybutadiene, epoxy resins of the novolak type, high polymers of glycidyl esters of unsaturated carboxylic acids, in particular of acrylic acid or methacrylic acid, and other compounds. Of particular interest are the epoxides based on epichlorohydrin and bisphenol A. By substitution of the bisphenol A, it is possible to influence the properties of these epoxides; for example, increased flame retardance is achieved if epoxides based on halogenated bisphenol A, eg. tetrabromobisphenol A or tetrachlorobisphenol A, are employed. Another group of suitable epoxides are those in which the terminal glycidyl groups are bonded via aliphatic or araliphatic radicals. A typical member of this class is the diglycidyl ether of butane-1,4-diol. For example, owing to the less rigid molecular structure, epoxides of this type lead to more flexible hardened products. If, instead of the polyhydric alcohols, amines are used with epichlorohydrin for the preparation of the epoxide compounds, epoxypropylamines having a structure similar to that of the glycidyl ethers are obtained. A typical compound of this type is bis-(epoxypropyl)aniline, which, because of its extremely low viscosity, can be employed as a bifunctional diluent. Important high molecular weight crosslinking compounds include epoxy resins of the novolak type. Because of their high functionality, they react with the photochemically produced carboxylic acid groups to give highly crosslinked systems having high heat distortion resistance.

If a cycloaliphatic epoxide whose molecule contains one or more cycloaliphatic rings but no aromatic rings is employed, it is possible, for example, to increase the shelf life and the stability to UV light. In the cycloaliphatic epoxides, the epoxide oxygen can be bonded exclusively to the cycloaliphatic rings, as, for example, in dicyclopentadiene dioxide, exclusively in the sidechains, as, for example, in the diglycidyl ester of hexahydrophthalic acid, or to the cyclic rings as well as the sidechain, as, for example, in vinylcyclohexane dioxide.

Other suitable crosslinking compounds are the conventional polyisocyanates containing two or more isocyanate groups per molecule, for example alkyl and cycloalkyl diisocyanates where alkyl or cycloalkyl is preferably of 4 to 41 carbon atoms, such as dimeric acid diisocyanate, isophorone diisocyanate, dicyclohexylmethane diisocyanate, butane-1,4-diisocyanate, hexamethylene diisocyanate, heptadecane diisocyanate, 2,2,4-trimethylhexamethylene diisocyanate or 2,6-diisocyanatomethyl caproate, isocyanurate-isocyanates, eg. the product from the reaction of toluylene 2,4-diisocyanate with hexamethylene diisocyanate, biurets, eg. hexamethylene diisocyanate biuret, aryl diisocyanates and triisocyanates, eg. toluylene diisocyanate, diphenylmethane diisocyanate, naphthylene diisocyanate, triphenylmethane triisocyanate or xylylene diisocyanate, mixed aliphatic/aromatic di- and triisocyanates, di- and triisocyanates containing functional groups, eg. carbonylisocyanates, such as carbonyl diisocyanate or isophthaloyl diisocyanate, sulfaryl isocyanates, sulfonyl diisocyanate, m-phenylenedisulfonyl diisocyanate, allophanate isocyanates, heteroatom-containing di- and triisocyanates, eg. reaction products of hexamethylcyclotrisilazane and diphenylmethane diisocyanate, as well as isocyanate-containing polymers, eg. copolymers of vinyl isocyanate, and hydroxyl and/or amino-containing polymers or polycondensates which have been reacted with an excess of a di- or triisocyanate.

Since, in the novel process, the photosensitive resist layer is brought to a state in which it can be hardened by heat only as a result of the action of light, it is not necessary for the isocyanate component to be blocked for the photosensitive resist material to have a long shelf life before it is processed by the method according to the invention. However, if in the process according to the invention it is desired to have a high degree of latitude between imagewise exposure of the photosensitive resist layer and development, for example particularly when these process steps do not automatically take place in succession, it is advantageous to use blocked isocyanates as the crosslinking component in the photosensitive resist layer. The blocked isocyanates undergo cleavage at elevated temperatures to give the starting components once again, so that when such isocyanates are used as crosslinking compounds the photosensitive layer, after imagewise exposure, is completely inert at room temperature and hence permits very great latitude in processing; on heating, the protective components are split off and the resulting free isocyanate groups react with the photochemically produced carboxylic acid groups and thereby cause crosslinking and hardening of the exposed resist layer.

Suitable protective components for blocking the isocyanates are mainly phenols, acetone-oxime, methyl ethyl ketoxime, ethyl acetoacetate or malonic ester;

however, compounds such as acetylacetone, phthalimide, caprolactam, benzenesulfonamide and 2-mercaptobenzothiazole are also suitable. A very suitable, highly effective blocked isocyanate compound is obtained, for example, from one mole of trimethylolpropane, 3 moles of 2,4-diisocyanatotoluene and 3 moles of phenol. Another example of a blocked isocyanate is the isocyanurate derivative obtained by trimerization of the reaction product of 2,4-diisocyanatotoluene with cresol. The blocked isocyanates prepared from toluylene diisocyanate, trimethylolpropane, butanediol and cresol are likewise very suitable crosslinking compounds.

Because they react readily with carboxylic acid groups, another group of very useful crosslinking compounds comprises the conventional carbodiimides, as formed by carbodiimidization of diisocyanates. If an $\alpha,\omega$-diisocyanatopolycarbodiimide is employed as the crosslinking compound, hardening the resist layer in accordance with the invention gives a dense network with the formation of polyacylurea. The carbodiimides can be based on either aromatic or aliphatic diisocyanates. One of the reasons why $\alpha,\omega$-diisocyanatopolycarbodiimides obtained from isophorone diisocyanate are very suitable as crosslinking compounds in the novel process is because, as blocked polyisocyanates, they ensure substantial processing latitude between imagewise exposure of the photosensitive resist layer and development.

Advantageous crosslinking compounds containing two or more reactive groups also include polymers containing hydroxyl or amino groups, for example phenol-formaldehyde resins, urea-formaldehyde resins and melamine-formaldehyde resins. Particularly suitable compounds of this class are the novolaks.

The high molecular weight crosslinking compounds containing the reactive groups, for example compounds of the last-mentioned type or the glycidyl-containing or isocyanate-containing polymers, are preferably used in the photosensitive resist layer when the latter contains o-nitrocarbinol ester-containing compounds having a relatively low molecular weight, and, as mentioned above, can then serve as a polymeric binder for the said layer. If this layer contains o-nitrocarbinol ester-containing polymers having a high molecular weight, the added crosslinking compounds containing reactive groups can have either a low or a high molecular weight, depending on the intended use and the spectrum of properties desired.

The ratio of the reactive groups in the crosslinking compound to the o-nitrocarbinol ester groups of the general formula (I) in the compounds containing these groups depends on the type of components employed and is varied, in particular, according to the spectrum of properties desired for the photosensitive resist layer and the relief images or resist images produced from this layer. It can therefore be varied within wide limits, but should in any case be chosen so that the desired degree of crosslinking and of hardening in the relief images and resist images is achieved. If it is important to have a high degree of crosslinking during hardening, very reactive crosslinking compounds are generally used, preferably in excess with respect to the o-nitrocarbinol ester groups. If a lower degree of crosslinking is sufficient, the amount as well as the reactivity of the crosslinking compounds can be reduced accordingly.

The photosensitive resist layers employed in the novel process can, in addition to the compounds possessing the o-nitrocarbinol ester groups and the compounds possessing reactive crosslinking groups and, where relevant, the polymeric binders, also contain other conventional additives and assistants. These additives and assistants can, on the one hand, be compounds which are added to simplify the production of the photosensitive resist layer or of the recording material. These include, for example, plasticizers or flow improvers. Plasticizers are incorporated into the photosensitive resist layer particularly when this layer is to be applied in the dry state to the permanent base, especially when this is done by a lamination process. Examples of plasticizing compounds, which should be compatible with the o-nitrocarbinol ester-containing compounds, in particular with the polymers, are tricresyl phosphate, n-butylbenzyl phthalate and liquid polyesters obtained from an aliphatic dicarboxylic acid and a bifunctional glycol, in particular polyesters obtained from adipic acid and propylene 1,2-glycol or butane-1,4-diol and having a viscosity of from 1,000 to 15,000 cp. If the crosslinking compounds which possess two or more reactive groups and are employed as components of the mixture are low molecular weight substances, these can also act as plasticizers and make the addition of separate plasticizing compounds partially or completely superfluous. The use of flow improvers, eg. silicone oils, is particularly advisable if the photosensitive resist layer is to be applied to a base by casting from solution.

On the other hand, the photosensitive resist layer can contain additives which improve or modify its performance characteristics. These include, for example, catalysts which accelerate the thermal hardening of the exposed resist layer, ie. the reaction of the free carboxyl groups with the reactive groups of the crosslinking compounds; sensitizers which improve the photosensitivity and the spectral sensitivity of the photosensitive resist layer; and dyes, pigments and/or photochromic substances.

Depending on the type of crosslinking compound used, suitable catalysts for the thermal hardening of the exposed resist layer are the acids and bases conventionally used for such reactions. However, it should be noted that this restricts the latitude between imagewise exposure of the photosensitive resist layer and its development, so that the amount of catalyst is in general kept small. In some cases, it is sufficient to add an amount of catalyst in the ppm range. Examples of catalysts are benzyldimethylamine, benzyltrimethylammonium hydroxide, diazabicyclooctane, N,N,N',N'-tetramethyl-1,3-diaminobutane, 2-dimethylamino-2-hydroxypropane, 2-diethylaminomethylphenol, 2,4,5-tri-(dimethylaminoethyl)-phenol, organo-tin compounds, such as tin octoate, etc.

Examples of sensitizers are xanthene dyes, such as fluorescein, eosin and rhodamine S, as well as triplet sensitizers as described, for example, by N. J. Turro in "Molecular Photochemistry", W. A. Benjamin Inc., New York 1967, page 132. Dyes which have proved useful for incorporation into the photosensitive resist layer include Sudan dyes, polymethine dyes, azo dyes, phthalocyanine dyes and dispersion dyes, as well as eosin, crystal violet and malachite green. Particularly advantageous dyes are those which undergo a reversible or irreversible color change on exposure to actinic light. For example, Sudan dyes, polymethine dyes or azo dyes are bleached out by added photoinitiators, such as benzoic ethers, benzil ketals, benzophenone or Michler's ketone, in the photosensitive layer, in the course of the imagewise exposure. The polymethine dyes of the general formula (II)

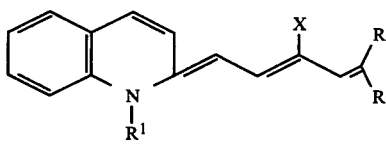

where $R^1$ is alkyl, $R^2$ is —CN, $R^3$ is —CN, —COOR$^4$ or —Ph—R$^5$, $R^4$ is alkyl, $R^5$ is —NO$_2$, halogen, alkyl or alkoxy and X is halogen, deserve special mention.

In the process according to the invention, the photosensitive resist layer is first applied to the permanent base on which the relief images or resist images are to be formed. As mentioned above, this can be effected, for example, by casting the photosensitive layer from solution. However, it is also possible first to apply the photosensitive layer to a temporary base and then to laminate the said layer, which is generally dry and solid, onto the permanent base by means of a lamination process, using pressure with or without the application of heat. The thickness of the photosensitive resist layer depends on the particular use. Since the novel process is particularly useful in thin-film technology, the thickness of the photosensitive resist layer is in general from 0.1 to 100 μm; when used as a solder mask, the thickness of the resist layer can be as high as 2,000 μm.

In a particular embodiment of the novel process, the photosensitive resist layer, which is generally dry and firm, is first produced on a temporary base, eg. a polyester film, preexposed uniformly to actinic light for a short time and then applied to the permanent base which constitutes the substrate for the relief image and resist image. This preexposure is preferably carried out frowm that side of the photosensitive resist layer which is subsequently applied to the permanent base, and can last for as long as 70% of the time for the subsequent principal imagewise exposure. This preexposure not only improves the adhesion of the photosensitive resist layer to the permanent base, in particular the metallic or metal oxide substrate, but surprisingly also increases the photosensitivity of the resist layer during the imagewise exposure, without in any way adversely affecting the faithful reproduction of the image during the production of the relief image or resist image. This preexposure can be carried out, by means of an illuminated zone, either during the production of the photosensitive film resist material or during lamination directly before application of the photosensitive layer to the permanent base, so that this embodiment of the process can be carried out without any particular additional expense or process steps.

The photosensitive resist layer applied to the permanent base is, in accordance with the invention, first exposed imagewise to actinic light in a conventional manner, through a suitable image-bearing transparency. Suitable light sources for this purpose are those which emit actinic light having a wavelength of from 200 to 600 nm, preferably from 300 to 420 nm, eg. carbon arc lamps, high-pressure mercury lamps, high-pressure xenon lamps and, in particular, low-pressure mercury fluorescence lamps. The times for the imagewise exposure, which depend in particular on the type and thickness of the photosensitive resist layer, are in general about 0.05–50 min, and also governed by the intensity of the light source used.

After the imagewise exposure of the photosensitive resist layer, during which, in the exposed areas, the o-nitrocarbinol ester groups undergo cleavage to form free carboxyl groups, the exposed areas of the layer are washed out with an aqueous developer. The developer can be water as such or a mixture of water with a water-soluble organic solvent, for example a mixture of water with an aliphatic alcohol, in particular methanol or ethanol, a ketone, eg. acetone, or a cyclic ether, eg. tetrahydrofuran. In particular, water is employed as the developer. The pH of the developer is advantageously higher than 7.5, and some or all of the free carboxyl groups are therefore converted to the salt form. The optimum amount of alkali, or the pH, is of course dependent on the layer material used and on the exposure time and luminous intensity, ie. on the amount of free carboxyl groups formed during the imagewise exposure. Alkalis which can be added to the developer are, for example, borax, disodium hydrogen phosphate, sodium carbonate or alkali metal hydroxides, and examples of suitable organic bases are diethanolamine and triethanolamine. For example, surfactants, sodium carboxymethylcellulose, polyvinyl alcohol, polysodium acrylate, etc. can also be added to the washout solution.

The other conditions (eg. duration and temperature) for the development of the resist layer which has been subjected to imagewise exposure should be matched to the processing latitude available. The photosensitive resist layer contains crosslinking compounds which are capable of reacting with the free carboxyl groups formed during the exposure, but the exposed areas of the layer should be removed, during development, completely down to the base, with the formation of a sharp image; consequently, the development is carried out as a rule directly after the imagewise exposure of the photosensitive resist layer. The exposed areas of the layer can be washed out in a conventional manner, for example by spraying, rubbing out or brushing out with the aqueous developer. To accelerate the development process, it is possible to employ elevated temperatures, for example as high as about 40° C., depending on the crosslinking compound present in the photosensitive layer. The development time is generally a few minutes.

In a particular embodiment of the novel process, the photosensitive resist layer is subjected several times to alternate imagewise exposure and development before finally being subjected to uniform post-exposure and thermal hardening. Before the second (and where relevant each subsequent) imagewise exposure, the areas of the base which have been bared by the development can be modified for example by etching or metal plating. The fact that multiple imagewise exposure can be carried out opens up new applications, particularly in the production of printed circuits.

After removal of those parts of the resist layer which have been exposed imagewise, and provided that no further imagewise exposure is to be carried out, that part of the photosensitive resist layer which remains on the base and which at this stage constitutes a positive image of the image-bearing transparency is post-exposed uniformly to actinic light, in accordance with the invention. Suitable light sources for this uniform post-exposure are those used for the abovementioned imagewise exposure. The duration of this uniform post-exposure is in general from 0.05 to 50 minutes, and depends in particular on the desired degree of hardening and hence on the spectrum of properties which the relief image or resist image is required to possess. The uniform post-exposure is therefore generally carried out using such a luminous intensity and for such a period that the number of free carboxyl groups formed in the photosensitive resist layer which has been exposed imagewise and developed is sufficiently high to effect the desired hardening.

After the uniform post-exposure, the resist layer is thermally crosslinked and hardened. Thermal hardening can, for example, be carried out at room temperature, but very long hardening times are generally required in this case. Advantageously, therefore, hardening is carried out at elevated temperatures, by heating the post-exposed resist layer, preferably at from 50° to 250° C., in particular at from 60° to 200° C. The hardening time, which can be from about 10 minutes to a few hours, eg. 5 hours, depends on the type and reactivity of the crosslinking compound employed, on the number of free carboxyl groups produced during uniform post-exposure, on the desired degree of crosslinking and hardening, on the layer thickness, etc. For example, crosslinking of the free carboxyl groups with epoxide compounds requires relatively high hardening temperatures. For example, an equimolar non-catalyzed mixture of a carboxylic acid and a diepoxide based on 2,2-bis-(p-hydroxyphenyl)-propane has to be heated for from 2 to 4 hours at about 150°–200° C. to convert all of the epoxide groups. The hardening can also be carried out stepwise, for example using an excess or less than the stoichiometric amount of an epoxide compound or in general of the crosslinking compounds, for example by first heating the mixture to about 150° C. and then carrying out final hardening at above 150° C., in particular at about 200° C. or above.

The novel process gives relief images or resist images which have high thermal stability particularly when exposed to thermal stresses of short duration and, depending on the component, are stable, for example, at temperatures of 270° C. or more, and possess excellent mechanical properties, high abrasion resistance, high dielectric strength and high tracking resistance as well as greatly improved resistance to corrosive process chemials, in particular to strong acids and alkalis, as may be used in the further processing of the relief images or resist images.

The relief images and resist images produced by means of this process are used, inter alia, for the production of thick-film circuits, thin-film circuits, for example for electronic engineering, and integrated circuits, semiconductors generally, printed circuits and solder masks, as well as for the production of offset printing plates. The techniques used for the production of printed circuits and offset printing plates are sufficiently known as such. The resist image produced according to the invention, for example after modification of the uncovered areas of the base, can, if desired, be removed from the base, for example by stripping with a suitable solvent, such as methylene chloride.

In thin-film technology, ceramic substrates are used as the base, for example for the production of thin-film circuits, these substrates being very suitable because of their dielectric properties and their thermal and chemical stability. In a number of processing steps, metallic and/or metal oxide layers, for example from 0.01 to 1 $\mu$m thick, are deposited uniformly one on top of the other by means of vapor deposition or sputtering. In the structured form, these layers assume the functions of ohmic resistors, capacitors, inductors, rectifiers, optoelectronic displays, adhesion promoters, conductor lines, superconductors, insulating layers, etc. The novel process is extremely useful for structuring these thin layers; this is done by a method in which the photosensitive resist layer is applied, in a thickness of from 0.1 to 50 $\mu$m, preferably from 3 to 10 $\mu$m, to the substrate, exposed imagewise in accordance with the desired structuring, developed, uniformly post-exposed and then thermally hardened. The uncovered substrate surfaces, such as metallic or metal oxide layers, can then be further treated by doping, etching or metal plating. The resist images produced according to the invention are stable to very corrosive etching baths and plating baths (for example concentrated nitric acid or ammoniacal copper(II) chloride solution), even at elevated temperatures. In addition to wet etching, the resist images produced according to the invention can also be employed for plasma etching at elevated temperatures ($<100°$ C.), as also used as a cleaning step in semiconductor technology.

In semiconductor technology, the base is, for example, a 0.5 mm thick silicon chip provided with a metal oxide layer. The production of active components, such as transistors and diodes, and their connection by means of conductor lines is described in detail in the relevant literature and therefore does not require further explanation here. To produce structuring by means of the novel process, 0.01–50, preferably 0.5–5, $\mu$m thick photosensitive resist layers are generally used, and a resolution of less than 10 $\mu$m, which is the value required today, is achieved without difficulty.

Owing to the excellent properties of the end product, the novel process can also advantageously be used for the production of solder masks; to do this, the photosensitive resist layer is applied, for example to the circuit board surface which contains the circuit diagram and is to be processed, and the layer is then exposed through a photomask, at the points at which eyelets are to be laid bare. The photosensitive resist layer is advantageously applied by means of a lamination process. After the eyelets have been laid bare by washing out the exposed resist layer with the developer, and uniform post-exposure and thermal hardening have been carried out, the remaining resist layer meets all the demands made on a solder mask. In the production of soldering masks by means of the novel process, it is also possible, in particular, to utilize the abovementioned possibility of multiple imagewise exposure; for this purpose, the photosensitive layer applied to the base to be treated is first exposed imagewise to give the desired conductive pattern, those areas of the base which have been laid bare by the development are modified by etching or metal plating to form the conductor lines, the holes in the printed circuit, or the eyelets, are then laid bare by further imagewise exposure and washing out, and the resist layer is then uniformly post-exposed and hardened.

In a special embodiment particularly suitable for the production of a solder mask for printed circuit boards or printed circuits, imagewise exposure can be carried out without the use of a special mask if the perforated circuit board assumes the function of the photomask. For this purpose, the photosensitive resist layer applied to the perforated circuit board is exposed from the opposite side through the holes in the circuit board. During exposure through the holes, it is advantageous to place a light-scattering film or a mirror, for example a finely brushed aluminum sheet, on the free surface of the photosensitive resist layer, ie. that surface which faces away from the circuit board; this applies in particular where the light source used emits a high proportion of non-parallel light beams. As a result, the photosensitive resist layer is more uniformly illuminated in the area of the holes, and hence the holes in this layer are accurately reproduced. In this variant of the novel process, only the areas of the holes are removed from the resist layer, so that the eyelet, ie. the annular conductive portion surrounding the hole, remains protected. This is desirable on the component side of the circuit board, or where solder-free methods, for example plug-in connectors, are used for connecting the components. In the latter case, the photomaskless variant of the process may also be employed on both sides of the circuit board.

The Examples which follow illustrates the invention. Parts and percentages are by weight, unless stated otherwise.

EXAMPLE 1

72 parts of a methyl methacrylate copolymer, containing 35% of o-nitrobenzyl acrylate, 27 parts of a bisphenol A diglycidyl ether (Epikote® 828 from Shell), 0.7 part of benzil dimethyl ketal, 0.1 part of a black dye and 0.2 part of a polymethine dye of the general formula (II), where $R^1$ is methyl, $R^2$ is nitrile, $R^3$ is —COOEt and X is chlorine, were dissolved in 160 parts by volume of ethyl acetate. A photosensitive layer was cast from this solution onto a polyethylene terephthalate film (temporary base), so that a layer about 10 μm thick was obtained after removal of the solvent and drying. The free surface of the resulting photosensitive resist layer was laminated, at 100° C. and at a rate of 0.5 m per minute, onto glass coated with aluminum by vapor deposition. The photosensitive resist layer was exposed imagewise to a 500 W ultra-high pressure mercury lamp for 25 minutes through a photographic positive and the polyethylene terephthalate film. Thereafter, the polyethylene terephthalate film was removed, and the exposed areas of the layer, which had become decolorized during exposure and hence were in good contrast to the unexposed areas, were washed out with a developer comprising 81% of water, 16% of 2-butoxyethanol and 3% of triethanolamine in the course of 20 minutes.

A sharp blue positive image of the original was obtained, and this was freed from residual developer with a compressed air jet. Thereafter, the resist layer was exposed uniformly, ie. over its entire surface, for 20 minutes, using the same lamp as that described above, and was then hardened successively at 60° C., 80° C., 100° C. and 120° C., for 30 minutes in each case. The bared areas of he aluminum were etched away for 1 minute at 60° C. in an etching bath comprising 1.5 liters of pure phosphoric acid, 150 ml of glacial acetic acid, 150 ml of nitric acid and 200 ml of deionized water. The aluminum protected by the resist image was not attacked. The sample was rinsed with water and the resist image was stripped with methylene chloride to give accurate aluminum conductor lines which represented a faithful reproduction of the photographic positive.

EXAMPLE 2

The procedure described in Example 1 was followed, except that in this case the photosensitive resist layer, before being laminated onto the aluminum-coated glass, was pre-exposed, on its free surface, to an ultra-high pressure mercury lamp for 75 seconds. As a result, it was possible to reduce the time of the imagewise exposure to 6 minutes, the development time to 5 minutes and the time for uniform post-exposure to 15 minutes. The resulting resist image was likewise very resistant to the etching bath for the aluminum.

EXAMPLE 3

The procedure described in Example 2 was followed, except that, instead of the aluminum-coated glass sheet, a palladium-coated substrate was used as the permanent base for the photosensitive resist layer. Thermal hardening of the exposed and developed resist layer was carried out in this case for 30 minutes at 60° C., 80° C. and 100° C., for 30 minutes at 120° C., for 30 minutes at 160° C. and for 120 minutes at 200° C. The resulting resist image was stable to a palladium etching bath, and, after the etching process, could be removed with hot dimethylformamide.

EXAMPLE 4

A solution prepared, in accordance with Example 1, from the components of the photosensitive layer was applied to a superficially oxidized silicon chip in a spin-coating apparatus at 5,000 rpm, using a glass syringe. The photosensitive resist layer was dried at 80° C., exposed imagewise through a chromium/glass mask, developed and then post-exposed uniformly. The post-exposed resist layer was hardened stepwise, as described in Example 3. The bared silicon dioxide areas were etched away with hydrofluoric acid down to the unoxidized silicon, and the resist layer was then stripped with hot dimethylformamide.

The bared silicon was p-doped with boron atoms in a conventional manner. The steps described above were then repeated, ie. the silicon chip as a whole was again oxidized and then coated with the photosensitive resist layer, a resist image was produced by imagewise exposure, development, post-exposure and hardening, the bared silicon dioxide areas were etched down to the unoxidized silicon, the resist layer was stripped and the silicon was then n-doped with phosphorus. Using the same photochemical process, connections were produced, and the sheet was then coated with aluminum by vapor deposition. The aluminum layer was structured, according to the method described in Example 2, so that the p-doped and n-doped zones were connected by the resulting aluminum conductor lines.

EXAMPLE 5

The procedure described in Example 1 was followed, except that, instead of the bisphenol A diglycidyl ether, 27 parts of a triisocyanate (prepared from 3 moles of hexamethylene diisocyanate and 1 mole of water) were employed in this case. The photosensitive resist layer was pre-exposed as described in Example 2 and then laminated onto aluminum-coated glass. Imagewise exposure was carried out for 15 minutes, and development for 6 minutes. Post-exposure and hardening were carried out as described in Example 1. A satisfactory resist image was obtained; the bared areas of the aluminum could be etched and plated without difficulty in conventional baths.

EXAMPLE 6

The procedure described in Example 3 was followed, except that, instead of the bisphenol A diglycidyl ether, 27 parts of the triisocyanate of Example 5, but with its biuret groups blocked with methyl ethyl ketoxime, were employed in this case. Imagewise exposure was carried out for 4 minutes, development for 3 minutes and uniform post-exposure for 15 minutes. Thermal hardening was carried out stepwise, for 3 hours at 160° C. and for 2 hours at 200° C. The resist was stable to etching baths.

EXAMPLE 7

The procedure described in Example 1 was followed, except that half (13.5 parts) of the bisphenol A diglycidyl ether was replaced by a corresponding amount of a triisocyanate prepared from 3 moles of hexamethylene diisocyanate and 1 mole of water. After pre-exposure as described in Example 2, imagewise exposure was carried out for 3 minutes, development for 2 minutes and uniform post-exposure for 15 minutes. Hardening was carried out as described in Example 3. Faithful reproduction of the original was obtained; the resist exhibited very good stability during further processing.

EXAMPLE 8

Two 50 μm thick photosensitive resist layers were produced on polyester films as temporary bases, as described in Example 1, except that in this case the methyl methacrylate copolymer used contained 25% of o-nitrobenzyl acrylate as copolymerized units. The photosensitive resist layers were laminated onto both sides of a printed circuit, the polyester film was removed and exposure was carried out for 4 minutes on both sides simultaneously through photographic transparencies, using a flat-plate exposure unit. The exposed areas of the layers were washed out in the course of 20 minutes with a developer comprising 81% of water, 16% of 2-butoxyethanol and 3% of triethanolamine. After removal of residual developer with compressed air, the sharp resist images, which corresponded exactly to the image-bearing transparencies, were post-exposed uniformly for 4 minutes using the same flat-plate exposure unit and were then hardened successively at 60° C., 80° C. and 120° C. for one hour in each case and then at 150° C. for 2 hours. The resulting solder masks possessed the desired electrical properties, thermal stability and very good mechanical strength. After the components had been inserted, the printed circuit provided with the solder masks was passed over a soldering wave.

EXAMPLE 9

The procedure described in Example 8 was followed, except that the photosensitive resist layers, before being laminated onto the printed circuit, were uniformly pre-exposed for 30 seconds from the side facing the printed circuit. As a result, it was possible to reduce the time for imagewise exposure to 2 minutes, the development time to 17 minutes and the time for uniform post-exposure to 2 minutes.

EXAMPLE 10

A solution of 110 parts of an acrylate copolymer (87% of 1-(o-nitrophenyl)-ethyl acrylate and 13% of acrylamide), 12 parts of a bisphenol A diglycidyl ether (Epikote ® 828 from Shell) and 1.2 parts of a blue dye in 800 parts of ethyl acetate was filtered and then applied to an eletrically roughened, anodically oxidized aluminum sheet suitable for offset printing (average peak-to-valley height: 3.5 μm) in such a manner that a photosensitive resist layer having a dry weight of 1.5 g/m² was obtained. The layer was air-dried at 60° C. and then exposed imagewise for one minute, through a photographic transparency, to a doped high-pressure mercury lamp 80 cm away.

Development was carried out in a spray-washer, using a mixture of 82 parts of water, 15 parts of 2-butoxyethanol and 3 parts of triethanolamine. After rinsing with water and treatment with 1% strength $H_3PO_4$, an offset printing plate was obtained whose properties were improved by uniform post-exposure for 10 minutes, followed by thermal hardening at 60° C., 80° C., 100° C., 120° C. and 150° C. for 30 minutes in each case. The number of copies to be expected from the offset printing plates before and after hardening were determined in the sand spray test. It was found to be about 100,000 for the unhardened plate and above 400,000 for the post-exposed and hardened plate.

We claim:

1. A process for the production of a relief image or a resist image, which constitutes a positive image of an image-bearing transparency, in which a solid photosensitive resist layer applied to a base is exposed imagewise to actinic light and the exposed areas of the resist layer are then washed out with an aqueous developer, wherein the photosensitive resist layer contains, as the photosensitive component, a compound possessing two or more aromatic and/or heteroaromatic o-nitrocarbinol ester groups of the formula (I)

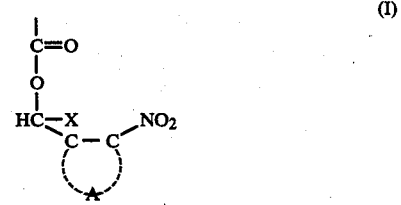

where A is a radical of an unsubstituted or substituted 5-membered to 14-membered aromatic or heteroaromatic ring system, and X is hydrogen, alkyl of 1 to 8 carbon atoms or an unsubstituted or substituted aryl or aralkyl radical, and wherein the said layer contains a compound which effects crosslinking and possesses 2 or more reactive groups which are capable of reacting with —COOH groups under the action of heat to form a covalent chemical bond, and wherein the said layer is exposed imagewise, developed, post-exposed uniformly to actinic light and then crosslinked and hardened under the action of heat.

2. A process as claimed in claim 1, wherein the photosensitive resist layer contains a compound possessing o-nitrocarbinol ester groups of the formula (I), in which the carbinol on which the o-nitrocarbinol ester groups of the formula (I) are based is o-nitrobenzyl alcohol, 2-nitro-6-chlorobenzyl alcohol, 2-nitro-4-cyanobenzyl alcohol, 2-nitro-4,5-dimethoxybenzyl alcohol, α-methyl-o-nitrobenzyl alcohol, α-phenyl-o-nitrobenzyl alcohol or α-(o-nitrophenyl)-o-nitrobenzyl alcohol.

3. A process as claimed in claim 1, wherein the photosensitive resist layer contains, as the compound possessing the o-nitrocarbinol ester groups of the formula (I), a di- and/or polyester of a low molecular weight di- and/or polycarboxylic acid and in addition a polymeric binder which is compatible with these esters.

4. A process as claimed in claim 1, wherein the photosensitive resist layer contains a polymer which has a molecular weight of above 500 and contains not less than 5% by weight, based on the molecular weight of the polymer, of aromatic and/or heteroaromatic o-nitrocarbinol ester groups of the formula (I) bonded in the molecule.

5. A process as claimed in claim 4, wherein the photosensitive resist layer contains a polymer which possesses o-nitrocarbinol ester groups of the formula (I) and is derived from a homopolymer or copolymer of acrylic acid, methacrylic acid, maleic acid, fumaric acid and/or crotonic acid.

6. A process as claimed in claim 1, wherein the photosensitive resist layer contains a compound, in particular a polymer, which, in addition to the o-nitrocarbinol ester groups of the formula (I), also contains the crosslinking reactive groups incorporated in the molecule.

7. A process as claimed in claim 6, wherein the compound possessing o-nitrocarbinol ester groups of the formula (I) contains, as crosslinking reactive groups, amine, imine, amide, epoxide, hydroxyl, isocyanate and/or blocked isocyanate groups.

8. A process as claimed in claim 1, wherein the photosensitive resist layer contains, in addition to the compound possessing the o-nitrocarbinol ester groups of the formula (I), one or more crosslinking compounds possessing 2 or more reactive groups of the type mentioned.

9. A process is claimed in claim 8, wherein the photosensitive resist layer contains, as a crosslinking compound, an epoxide possessing two or more epoxide groups or an isocyanate possessing two or more free or blocked isocyanate groups.

10. A process as claimed in claim 8, wherein the crosslinking compound is an $\alpha,\omega$-diisocyanatopolycarbodiimide.

11. A process as claimed in claim 8, wherein the crosslinking compound contains two or more hydroxyl and/or amino groups.

12. A process as claimed in claim 1, wherein the photosensitive resist layer contains, as further additives, plasticizers, flow improvers, catalysts for the thermal hardening, sensitizers, dyes, pigments and/or photochromic substances.

13. A process as claimed in claim 1, wherein the thermal crosslinking and hardening of the post-exposed resist layer is carried out at from 50° to 250° C.

14. A process as claimed in claim 1, wherein the photosensitive layer is from 0.1 to 2,000 $\mu$m thick.

15. A process as claimed in claim 1, wherein the dry, solid photosensitive resist layer is laminated onto the base using pressure with the optional application of heat.

16. A process as claimed in claim 15, wherein the photosensitive resist layer, before being applied to the base, is pre-exposed uniformly for a short time to actinic light, on that side which faces the base.

17. A process as claimed in claim 1, wherein the photosensitive resist layer, before being uniformly post-exposed and thermally hardened, is subjected several times to alternate imagewise exposure and washing out with the developer, and, after washing out but before each subsequent imagewise exposure, the bared areas of the base are modified.

18. A process as claimed in claim 1, wherein the photosensitive resist layer is applied to a perforated base, and, using the latter as a photomask, is exposed imagewise through the perforations therein.

19. A process as claimed in claim 18, wherein, before imagewise exposure, a light-scattering of reflecting layer, film or sheet is applied to that surface of the photosensitive resist layer which faces away from the base.

* * * * *